United States Patent
Tang et al.

(10) Patent No.: US 8,194,371 B2
(45) Date of Patent: Jun. 5, 2012

(54) INTEGRATED CIRCUIT PROTECTION DEVICE

(75) Inventors: Chin-Hsin Tang, Jhudong Township, Hsinchu County (TW); Jian-Hsing Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 530 days.

(21) Appl. No.: 12/419,608

(22) Filed: Apr. 7, 2009

(65) Prior Publication Data

US 2010/0254050 A1 Oct. 7, 2010

(51) Int. Cl.
*H02H 9/00* (2006.01)
(52) U.S. Cl. ........................................................ 361/56
(58) Field of Classification Search ................. 361/56
See application file for complete search history.

(56) References Cited

U.S. PATENT DOCUMENTS

| | | | |
|---|---|---|---|
| 5,296,726 A * | 3/1994 | MacElwee | 257/213 |
| 5,519,242 A | 5/1996 | Avery | |
| 5,751,041 A | 5/1998 | Suzuki et al. | |
| 5,966,517 A | 10/1999 | Cronin, III et al. | |
| 6,093,626 A * | 7/2000 | Su et al. | 438/532 |
| 6,277,723 B1 | 8/2001 | Shih et al. | |
| 6,417,544 B1 | 7/2002 | Jun et al. | |
| 6,566,716 B2 * | 5/2003 | Lin et al. | 257/355 |
| 6,611,024 B2 | 8/2003 | Ang et al. | |
| 6,624,480 B2 * | 9/2003 | Lin et al. | 257/355 |
| 6,664,140 B2 | 12/2003 | Lee et al. | |
| 6,862,723 B1 * | 3/2005 | Wang et al. | 716/112 |
| 7,253,453 B2 | 8/2007 | Ker et al. | |
| 7,560,778 B2 * | 7/2009 | Cain et al. | 257/355 |
| 2003/0075762 A1 * | 4/2003 | Lin et al. | 257/355 |
| 2006/0187596 A1 * | 8/2006 | Cain et al. | 361/56 |
| 2007/0008668 A1 * | 1/2007 | Cain et al. | 361/56 |
| 2010/0157493 A1 * | 6/2010 | Guedon et al. | 361/56 |
| 2011/0181630 A1 * | 7/2011 | Smith et al. | 345/690 |
| 2011/0215393 A1 * | 9/2011 | Yang | 257/316 |

* cited by examiner

*Primary Examiner* — Ronald W Leja
(74) *Attorney, Agent, or Firm* — Haynes and Boone, LLP (57) ABSTRACT

A semiconductor device is provided. In an embodiment, the semiconductor device includes an inverter. The inverter is coupled to an NMOS device. The NMOS device may be protection device which protects the inverter from charging effects and/or plasma induced damage. The NMOS device may be coupled to a power source (e.g., Vss). The NMOS device may be further coupled to a capacitor. The charge of the capacitor may discharge a current through the NMOS device to the power source.

17 Claims, 8 Drawing Sheets

Fig. 8

INTEGRATED CIRCUIT PROTECTION DEVICE

BACKGROUND

The present disclosure relates generally an integrated circuit device and, more particularly, a protection device for an integrated circuit.

Antenna diodes are diodes that are used in semiconductor devices to protect against electrostatic discharge events such as plasma-induced damage. The antenna diodes are placed in the integrated circuit to provide a discharge path for a charge developed during the fabrication of the device such as charges induced from use of plasmas during the processing (e.g., etching). Antenna diodes are typically connected to conductive lines that would be connected to a gate of an active device of the circuit that may be susceptible to damage from these charges. Though antenna diodes may be useful to protect from plasma induced damage (PID) and/or antenna effects, other accumulation of charges may not be mitigated.

Therefore, what is needed is an improved protection device for an integrated circuit.

SUMMARY

Provided is a protection device for an integrated circuit. The protection device includes an NMOS device. The NMOS device is coupled to a gate of an active device, such as an inverter. The protection device may provide protection from plasma-induced-damage (PID) as well as charging effects which may damage of the active device. The NMOS protection device provides a path to a voltage source, e.g., ground or Vss, for a charge built up during processing.

DETAILED DESCRIPTION

The present disclosure relates generally to an integrated circuit device and, more particularly, to a protection device for an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a semiconductor device or integrated circuit including a protection device. The protection device provides protection from plasma induced damage (PID) during integrated circuit fabrication processes. In addition, as described in further detail below, the protection device may provide protection from charging effects.

During fabrication, the semiconductor devices are typically subjected to numerous processes using plasma, for example, plasma etching or reactive ion etch (RIE), thin film deposition, ashing, and/or other processes including plasma. For example, interconnections may be formed by etching patterns (e.g., lines) in blanket conductive layers. The energies used to perform such processing may cause integrated circuit layers including the interconnect lines, gate electrodes, to become electrically charged. These conductive lines then act as an antenna, collecting charge. As the conductive lines may be connected to a gate of a device. The charge build-up can cause damage to the gate dielectric (e.g., gate oxide) of the device. In particular, the charge excesses may degrade the device performance, for example, trapped charges can lower the breakdown voltage of the gate.

The conventional embodiments provide a diode (e.g., antenna diode) or diode-like device, which provides a discharge path for electrical charge accumulated on a gate electrode layer (e.g., polysilicon). The diode is connected to a gate electrode of an active device of the integrated circuit. Thus, when plasma processing is performed, charges can flow into the substrate through the diode, thereby reducing the damage from the plasma. Embodiments using a diode are provided in FIGS. 3, 5 and 6.

Other sources of protection may be required however. For example, a charging effect may occur from a charge accumulated through frictional or electrostatic induction processes. A charging effect may be distinct from the antenna affect discussed above. The charging effect may occur when the device acquires a charge through frictional or electrostatic induction processes and then abruptly touches a grounded object. The charge may be accumulated in a substrate on which the device is formed. The discharge of a charging effect event can take place very quickly—for example, measured in nanoseconds (e.g., less than 2 nanoseconds). This is in contrast to antenna effects (or PID events) described above, which are typically in the μ second to millisecond range. An example of a charging effect is the charge that is accumulated by grinding the backside of a substrate of an integrated circuit device. The charge effect can damage the gate dielectric, interlayer dielectric (ILD), and/or other insulator layers. Thus, without protection, the charging effect may induce yield loss. The susceptibility of a device to a charging effect may be determined by using a charged device model (CDM) test.

One exemplary embodiment of a process causing a charge effect is a scrubber (clean) process. The scrubber process may cause a charge coupling effect. For example, a semiconductor device on the substrate being processed by the scrubber may inherently include capacitors (e.g., between metal interconnect layers formed on the substrate). Such capacitors include capacitors having a top plate at a top most conductive layer of the substrate. For example, a capacitor may be formed by a top metal layer (e.g., dummy metal or power bus features) and an interconnect signal line formed in an underlying metal layer. The charge coupling effect may include the accumulation of a charge on the top plate of a capacitor of the semiconductor device (e.g., form on a large area of conductive material, such as a power bus or dummy metal area). This charge may be accumulated from frictional and/or other sources during processing (e.g., scrubber clean). The accumulation of charge can induce a current though the capacitor which may reach an active device of the integrated circuit and cause damage.

Figure 1:
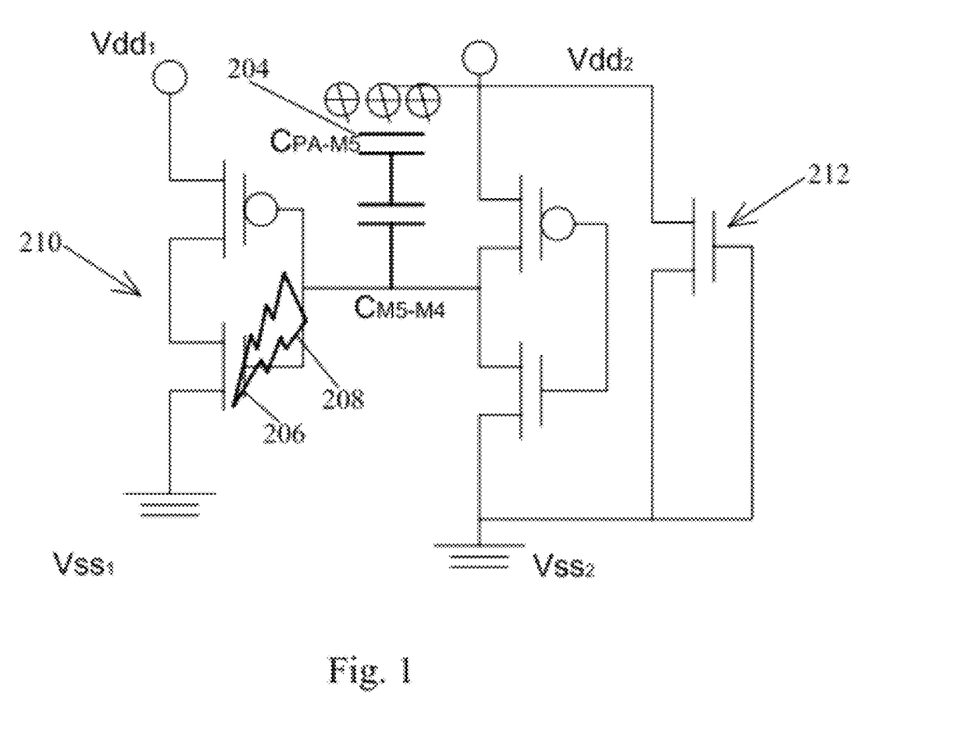
FIG. 1 is a schematic illustrating an embodiment of an integrated circuit susceptible to damage from charging effects.
Figure 2:
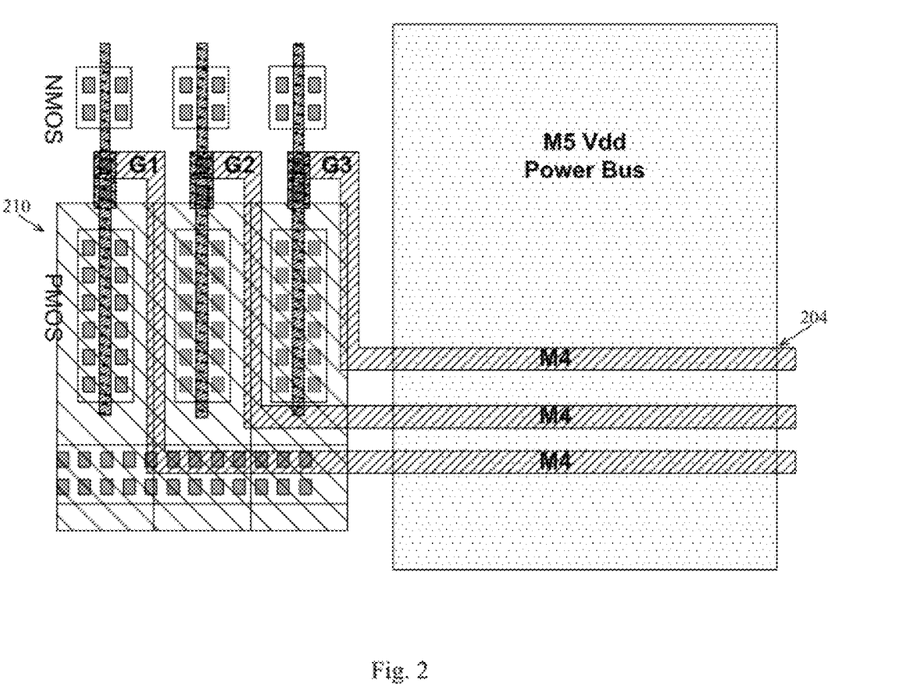
FIG. 2 is a top view of an embodiment of a layout design of an integrated circuit, corresponding to the integrated circuit of FIG. 1.

FIG. 1 illustrates an exemplary integrated circuit schematic and FIG. 2 the corresponding semiconductor device layout. The circuits include typical CMOS circuit components. It should be noted that FIGS. 1 and 2 are exemplary only and not intended to be limiting in any manner. FIGS. 1 and 2 are exemplary of a charging effect damage to an integrated circuit (semiconductor device). A charge 202 may accumulate on a top plate of a capacitor 204. The charge 202 may develop from a fabrication process, for example, as described above with a scrubber clean process. The charge 202 causes a high current to flow through the capacitor 204 and damage the gate of a transistor 206. The damage is illustrated as reference 208. The damage 208 may include damage to the gate dielectric (e.g., gate oxide) of the transistor 206. The transistor 206 is a transistor of an active semiconductor device, specifically the inverter 210. The inverter 210 may be included in receiver circuitry of the semiconductor device.

It is noted that the circuit 200 also includes an ESD protection device 212. The ESD device 212 cannot protect the circuit from the damage 208 as it is located a distance from the susceptible device transistor 206. The ESD protection device 212 may be an input protection circuit. For example, the input protection circuit is provided between the CMOS inverter (210) and a contact pad (e.g., bonding pad) that serves as a connection to outside of the circuit. The ESD protection device 212 may include ESD protection devices known in the art, for example, as found in a standard cell library of a design library. The ESD protection device may protect against ESD event such as measured by a human body model (HBM) or machine model (MM) test.

In an embodiment, the damage 208 causes device level failures such as increased $I_{dd}$, for example, an increased $I_{dd}$ in a sleep state. The existence of the damage 208 and/or the extent of the damage 208 may be dependent upon the maximum voltage of the suspect transistor (e.g., gate to source voltage), the amount of charge provided, the size of the capacitor (e.g., thickness of an insulating layer), and/or other factors.

One solution to charge accumulation from plasma processing in an integrated circuit is the addition of a junction diode. For example, as described above with reference to PID, a junction diode may provide a path for antenna effects to be discharged. However, a conventional junction diode coupled to a gate of the inverter 210 may not protect the circuit 200 because the damage 208 will occur prior to the diode being turned on.

Figure 3:
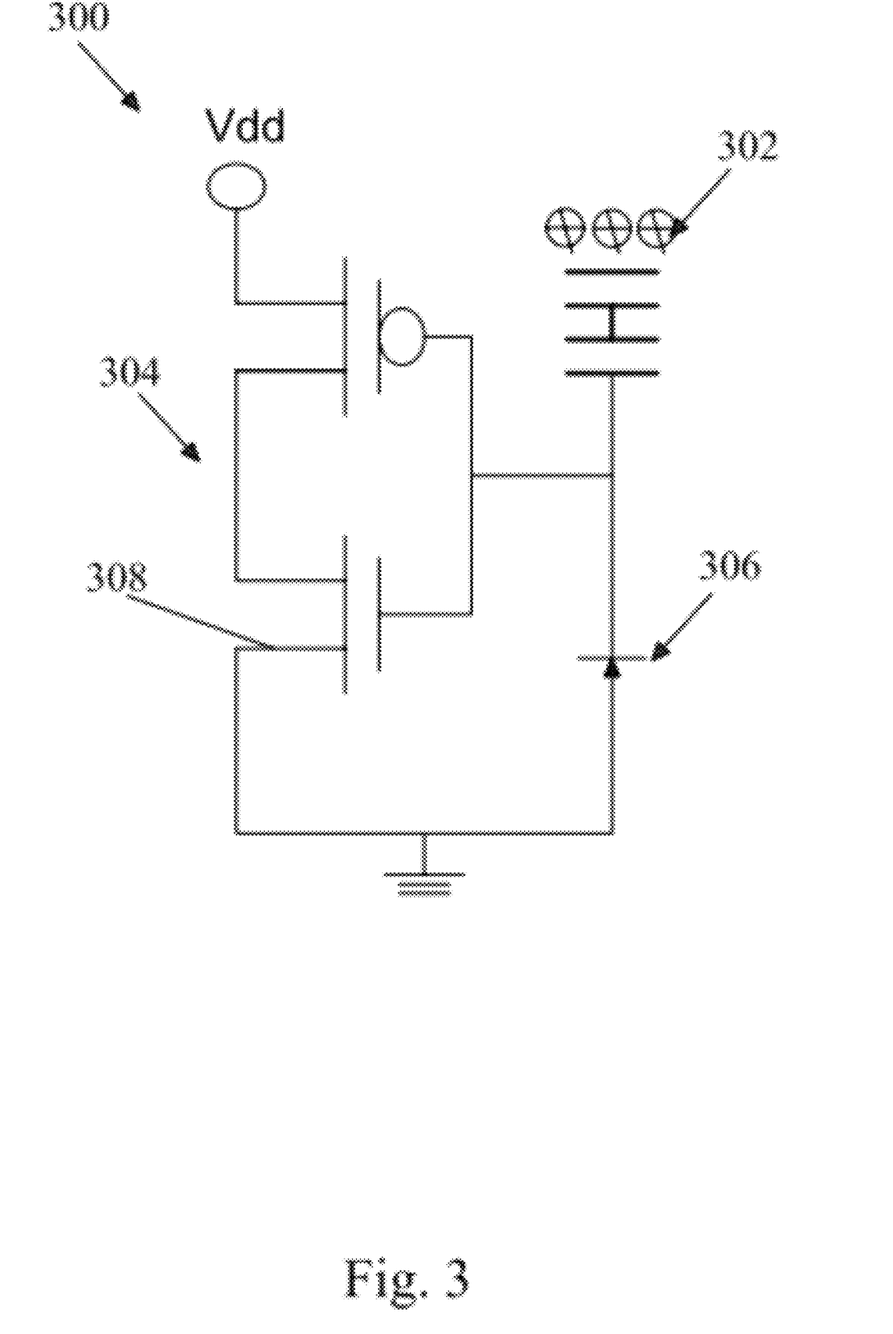
FIG. 3 is a schematic of an embodiment of an integrated circuit including a junction diode.

By way of example, FIG. 3 illustrates a schematic of an integrated circuit 300 which is substantially similar to the circuit 200 described above. The circuit 300 includes a capacitor with a charge 302 accumulated on the top plate. An inverter 304 is coupled to an antenna diode 306. The inverter 304 may be substantially similar to the inverter 210. This configuration may still provide damage, for example, to the transistor 308 because the charge 302 will cause a high current through the transistor 308 prior to the diode 306 turning on. Thus, further protection is required.

Figure 4:
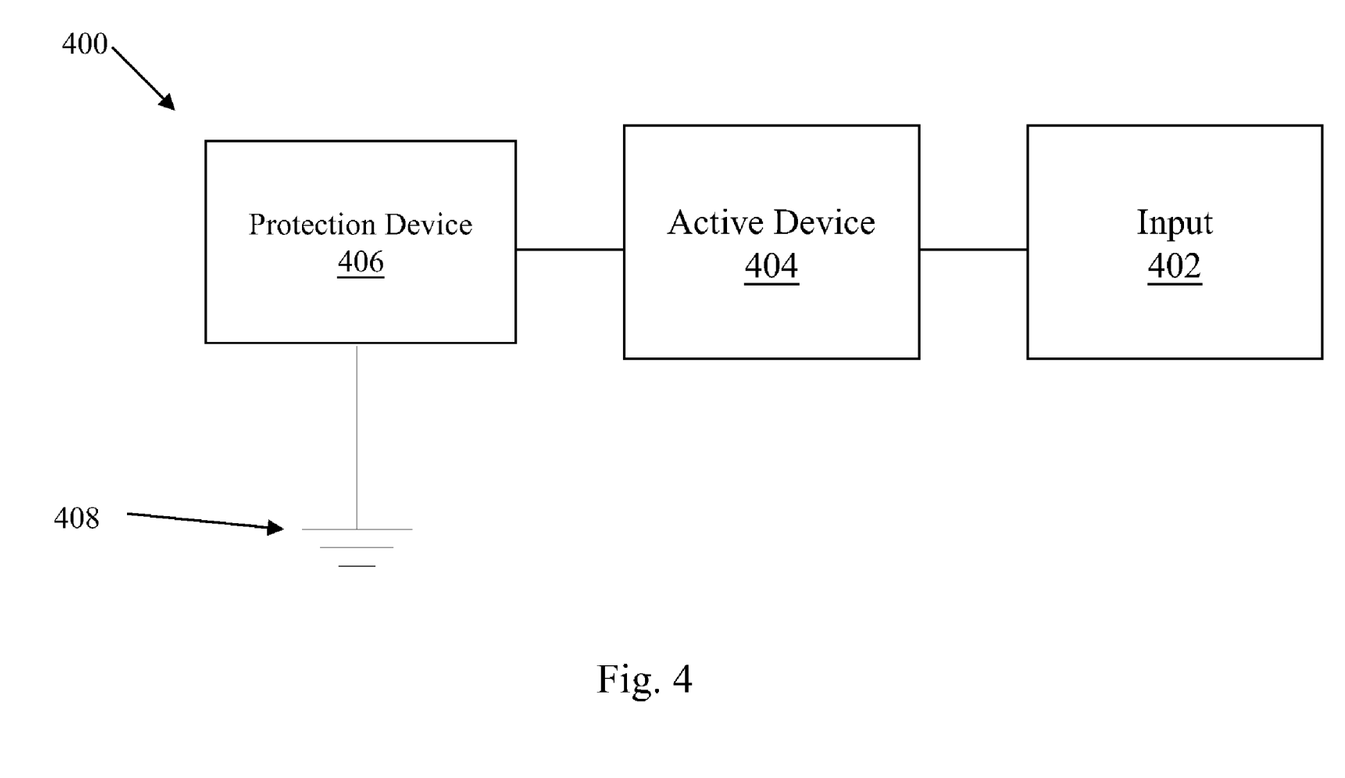
FIG. 4 is a block diagram of an embodiment of features of a semiconductor device.

FIG. 4 is a block diagram illustrating a protection system 400. The block diagram includes an input 402, an active device 404, a protection device 406, and a power source 408, e.g., ground or Vss. In an embodiment the input 402 is a second power source, for example, Vdd (e.g., 1.8V). The input 402 may include a pad (e.g., a bond pad). In an embodiment, the active device 404 includes an inverter. For example, the active device 404 may include an inverter substantially similar to the inverter 210 and/or 304, described above with reference to FIGS. 2 and 3 respectively. In an embodiment, an ESD protection device is provided in series between the input 402 and the active device 404 that protects the active device 404 from ESD events. The ESD protection device may protect from human body model (HBM) or machine model (MM) type of ESD discharges.

In an embodiment, the protection device 406 is an NMOS protection device. The NMOS device may be coupled to a gate of a device of the active device 404. In an embodiment, the NMOS device is coupled to a gate of a transistor of an inverter of the active device 404. The protection device 406 may include an antenna diode in addition to the NMOS device. The protection device 406 may protect the active device 404 from a charging effect and/or plasma induced damage (PID). The protection device 406 may serve to direct a current formed from a charge accumulation to the power source 408, rather than through the active device 404. Exemplary embodiments of the system of the system 400 are provided in FIGS. 7 and 8.

Figure 5:
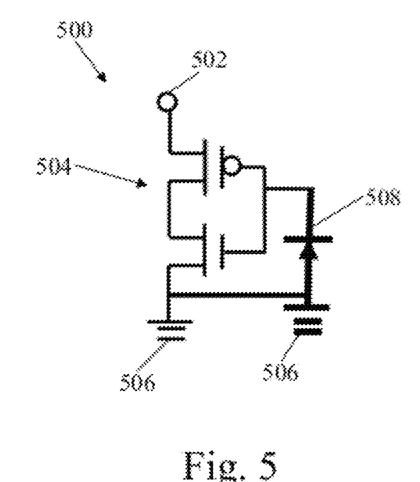
FIG. 5 is a schematic of an embodiment of an integrated circuit including a diode protection device.
Figure 6:
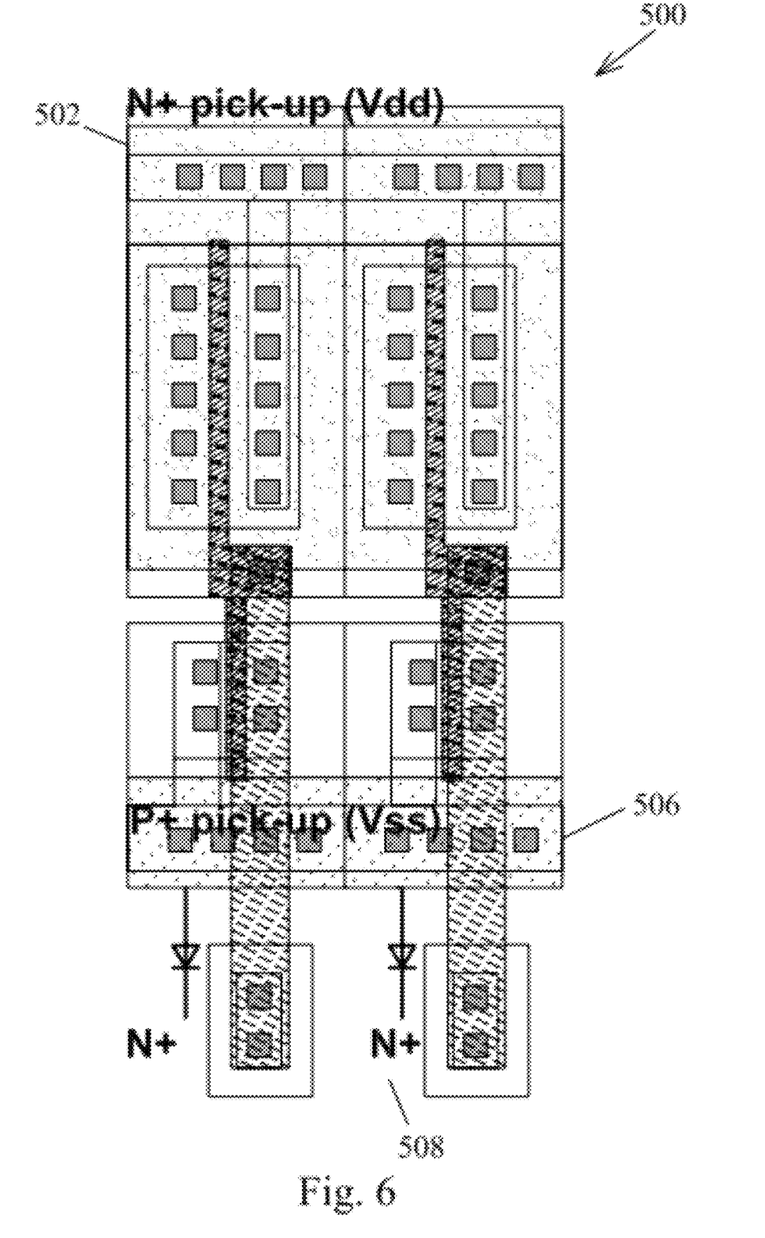
FIG. 6 is a top view of an embodiment of an integrated circuit layout corresponding to the schematic of FIG. 5.

FIG. 5 illustrates an embodiment of a circuit 500. The circuit 500 includes a power source 502 (e.g., Vdd), an inverter 504, a power source 506 (e.g., Vss or ground), and a diode 508. In an embodiment, the Vdd source 502 is approximately 1.8V, though numerous other embodiments are possible. In an embodiment, the power source 506 is a Vss connection of approximately 1.8V, however numerous other embodiments are possible. The power source 506 may tied to the bulk semiconductor substrate on which the circuit 500 is formed. The power source 506 of the circuit 500 is illustrated as two separate nodes, however, other embodiments are possible. The inverter 504 includes a plurality of devices: a PMOS device (p-channel transistor) coupled with an NMOS device (n-channel transistor). The diode 508 may include an antenna diode. The diode 508 may be be a p-n junction diode. In an embodiment, the diode 508 may include a p+ doped region adjacent an n+ doped region formed on a semiconductor substrate. The diode 508 may protect the inverter 504 from damage caused by PID or antenna effects such as described above. However, the circuit 500 has disadvantages in that the diode 508 can not protect the inverter 504 from damage from charging effects, as also described above with reference to FIGS. 1 and 3. FIG. 6 illustrates a circuit layout diagram of a semiconductor device corresponding to the circuit 500.

Figure 7:
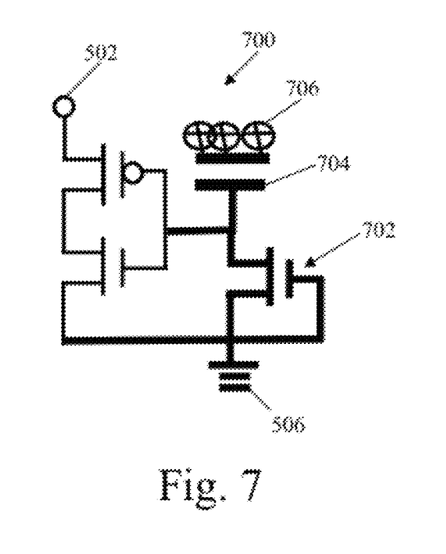
FIG. 7 is a schematic of an embodiment of an integrated circuit including an NMOS protection device.
Figure 8:
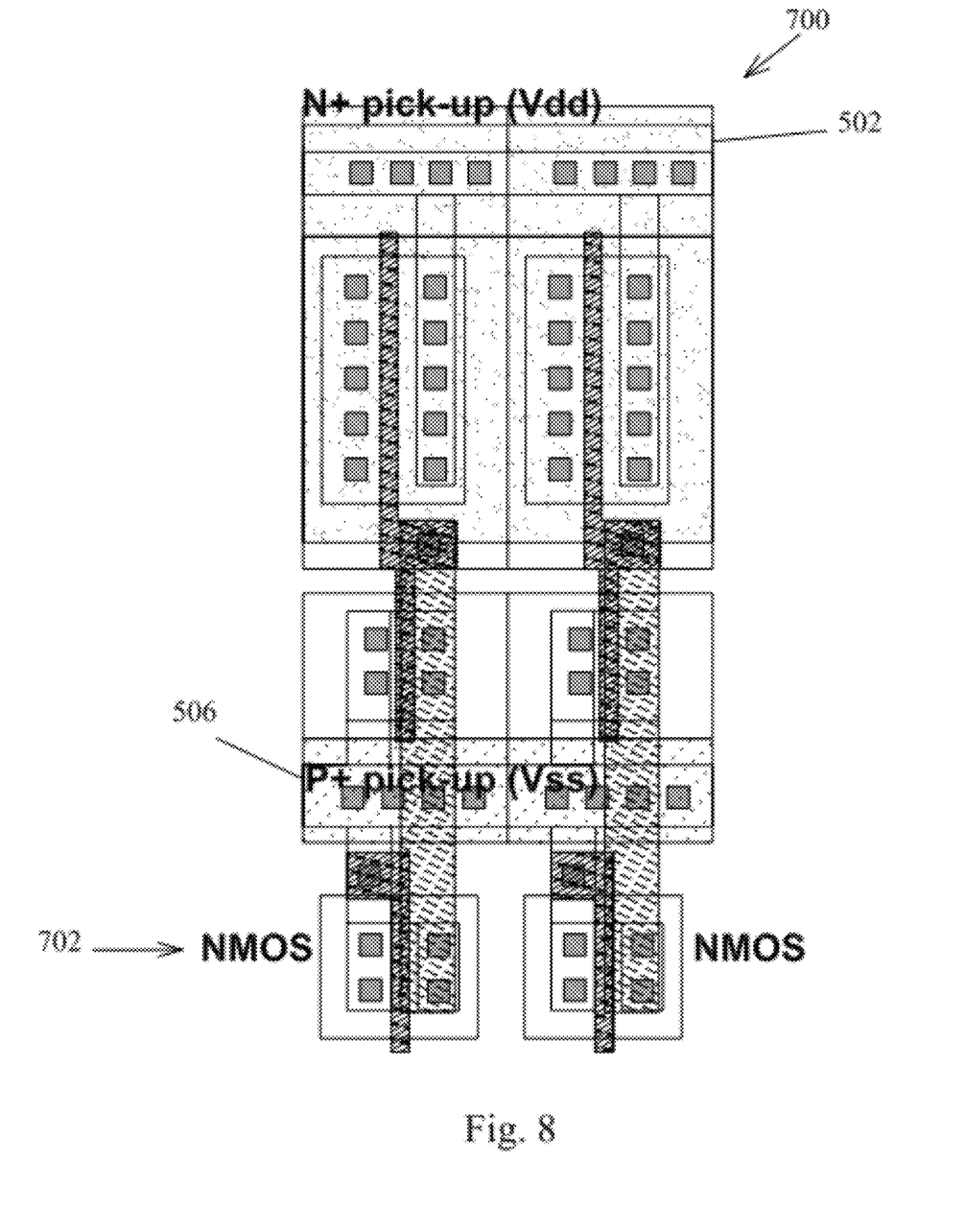
FIG. 8 is a top view of an embodiment of an integrated circuit layout corresponding to the schematic of FIG. 7.

FIG. 7 illustrates a circuit 700. The circuit 700 may include improved protection, for example, from charging effect in comparison with the circuit 500. The circuit 700 includes the power source 502, the power source 506, and the inverter 504, substantially similar to as described above with reference to FIG. 5.

The inverter 504 is coupled to an NMOS protection device 702 (e.g., an n-channel MOSFET device). The inverter 504 may provide means to turn on the protection device 702. The protection device 702 is further coupled to a capacitor 704 and to the power source 506. The capacitor 704 has a charge 706 built up on a plate. The protection device 702 allows the charge 706 to dissipate through a current through the NMOS device 702, when turned on, to the power source 506. Thus, the inverter 504 is not subjected to a high current developed from the accumulated charge 706, which may damage the inverter 504 (e.g., a gate of the inverter 504). This may be an improvement over the circuit 500 which does not include such a path for an accumulated charge as the diode 508 may not turn on until after a portion of the inverter 504 is damaged.

More particularly, the drain of the protection device 702 is coupled to a gate(s) of the inverter 504. The gate of the protection device 702 is coupled to the source of a device (e.g., NMOS device) of the inverter 504. Though illustrated as being coupled to ground, the protection device 702 may be coupled to any voltage source, for example, a substrate bias, Vss, or other voltage source 506.

The protection device 702 includes an n-type drain, an n-type source, and a p-type channel region formed in a semiconductor substrate. The protection device 702 further includes a gate structure over and insulated from the channel region. The protection device 702 may includes a source and drain that are n+ regions formed on a p region (e.g., well) of a semiconductor substrate. Example n-type dopants include arsenic, phosphorous, antimony, and/or other suitable dopants. Examples of p-type dopants include boron, $BF_2$ and/or other suitable dopants. The doping may be accomplished using conventional processes such as ion implantation or diffusion.

The protection device 702 includes a gate having a gate electrode overlying a gate dielectric. The gate dielectric may include silicon oxide, high dielectric-constant (high-k) materials, silicon oxynitride, combinations thereof, and/or other suitable materials. Examples of high-k materials include hafnium silicate, hafnium oxide, zirconium oxide, aluminum oxide, hafnium dioxide-alumina ($HfO_2$—$Al_2O_3$) alloy, combinations thereof, and/or other suitable compositions. The gate dielectric may be formed using chemical vapor deposition (CVD), physical vapor deposition (PVD), atomic layer deposition (ALD), thermal oxidation, combinations thereof, and/or other suitable processes. In an embodiment, the gate electrode includes polysilicon. In other embodiments, the gate structure may be a metal gate with the gate electrode including a metal composition. Examples of suitable metals for forming the gate electrode include Cu, W, Ti, Ta, TiN, TaN, NiSi, CoSi, and/or combinations thereof. The gate electrode layer may be formed by conventional methods known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. Similar materials and/or processes may be used to form the devices of the inverter 504.

The circuit 700 may be formed on a semiconductor substrate. In an embodiment, the substrate is silicon in a crystalline structure. In alternative embodiments, the substrate may include other elementary semiconductors such as germanium, or includes a compound semiconductor such as, silicon carbide, gallium arsenide, indium arsenide, and indium phosphide. The substrate may include a silicon on insulator (SOI) substrate.

The substrate may be suitably doped (e.g., n-type and p-type) to provide the semiconductor devices of the inverter 504 and the protection device 702. The dopants may be provided using processes known in the art such as, ion implantation, diffusion, thermal processing, and/or other suitable processes.

The capacitor 704 may be formed from two conductive regions ("plates") interposed by an insulator, e.g., dielectric material. In an embodiment, the first conductive plate is formed by a power bus and/or a dummy metal region. The first conductive plate may be formed in a top metal layer (e.g., metal layer 5 by way of example only and not intended to be limiting). The second conductive plate may be formed by an interconnect line. For example, in an embodiment, the second conductive plate is formed by an interconnect line formed a lower metal layer (e.g., metal layer 4 by way of example and not intended to be limiting). An interlayer dielectric (ILD) may be disposed between the upper and lower conductive "plates." In an embodiment, the capacitor holds the charge 706 formed by a semiconductor processing step. For example, the charge 706 may be formed by use of a scrubber clean process. In other embodiments, the charge 706 may form on any top conductive area (e.g., a feature formed in a top metal layer) overlying a second metal area. Note that the term "top" is relative only (e.g., nearest the friction source) and not intended to provide an absolute direction. FIG. 7 illustrates a layout diagram of the circuit 700 including the protection devices 702. As illustrated in FIG. 7, the addition of the protection device 702 may not increase the footprint (size) of the semiconductor device.

Therefore, provided is a circuit and semiconductor device that may provide protection from charging effects and PID. The circuit and semiconductor device include a protection device including an NMOS device which is coupled to an active device. For example, the NMOS device may be coupled to a gate of a device of an inverter. The NMOS device may allow dissipation of a charge accumulated on a capacitor of the circuit to ground without damaging an active device. A conventional ESD protection circuit (e.g., an input protection circuit) may be located too great a distance from the charge to adequately dissipate it without damage to an active device. Furthermore, a conventional diode in series with the active device and a voltage source may be inadequate to prevent damage from a charging effect.

What is claimed is:

1. A semiconductor device, comprising:
a substrate;
an inverter device formed on the substrate;
a protection device, wherein the protection device includes:
    an n-channel transistor device formed on the substrate coupled the inverter device; and
    a capacitor coupled to a drain of the n-channel transistor such that the n-channel transistor provides a path for a charge accumulated on the capacitor to flow into the substrate; and
a first voltage source, wherein the source of the n-channel transistor is coupled to the first voltage source.

2. The semiconductor device of claim 1, wherein the inverter includes a first device and a second device, wherein the first device is a PMOS device electrically coupled to a second voltage source and wherein a gate of at least one of the first and second devices is coupled to the n-channel transistor.

3. The semiconductor device of claim 2, wherein the gate of the at least one of the first and second devices of the inverter is electrically coupled to a drain of the n-channel transistor.

4. The semiconductor device of claim 1, wherein the capacitor is operable to hold a charge accumulated during fabrication of the semiconductor device.

5. The semiconductor device of claim 1, wherein the first voltage source is the substrate, and wherein the substrate is electrically grounded.

6. The semiconductor device of claim 1, wherein the source of the second device of the inverter is electrically coupled to the gate of the n-channel transistor.

7. The semiconductor device of claim 1, wherein the capacitor includes a top metal layer formed on the substrate.

8. An integrated circuit, comprising:

an input pad;

an ESD protection device coupled to the input pad;

an active device coupled to the ESD protection device; and a protection device coupled to the active device, wherein the protection device includes an NMOS transistor and a capacitor, wherein the capacitor is electrically coupled to the active device and the NMOS transistor, wherein the NMOS transistor is electrically coupled to a power source, and wherein the NMOS transistor provides a path for a charge accumulated on the capacitor to flow into the power source.

9. The integrated circuit of claim 8, wherein the active device is an inverter.

10. The integrated circuit of claim 8, wherein a source of the NMOS device is electrically coupled to the power source.

11. The integrated circuit of claim 8, wherein a current flows from the capacitor through the NMOS transistor of the protection device to the power source.

12. The integrated circuit of claim 8, further comprising:

means to turn on the NMOS transistor, thereby providing an on-state NMOS transistor; and wherein a current flows from the capacitor through the on-state NMOS transistor to the power source.

13. The integrated circuit of claim 8, wherein the capacitor includes a power bus and an underlying interconnect line.

14. A method, including:

determining a circuit layout of a semiconductor device, the circuit layout including a capacitor connected to a first transistor and connected to an NMOS transistor, wherein the NMOS transistor is further coupled to a power source;

fabricating the circuit layout on a semiconductor substrate, wherein the fabricating includes:

forming a plurality of conductive layers on the semiconductor substrate, wherein the plurality of conductive layers includes a top metal layer disposed furthest from a surface of the semiconductor substrate;

forming the capacitor on the semiconductor substrate, wherein the capacitor includes the top metal layer;

forming the first transistor coupled to the capacitor;

forming the NMOS transistor coupled to the capacitor; and generating a charge on the top metal layer of the capacitor, wherein the generating the charge includes providing a current from the capacitor through the NMOS transistor to the power source.

15. The method of claim 14, wherein the forming the first transistor includes forming an inverter.

16. The method of claim 14, wherein the generating a charge includes applying a frictional force to the semiconductor substrate.

17. The method of claim 16, wherein the applying the frictional force includes a scrubber process.

* * * * *